United States Patent [19]

Nishioka et al.

[11] Patent Number: 4,636,833

[45] Date of Patent: Jan. 13, 1987

[54] SEMICONDUCTOR DEVICE

[75] Inventors: Yasushiro Nishioka, Hachioji; Noriyuki Homma, Kokubunji; Noriyuki Sakuma; Kiichiro Mukai, both of Hachioji, all of Japan

[73] Assignee: Hitachi, Ltd., Tokyo, Japan

[21] Appl. No.: 590,870

[22] Filed: Mar. 19, 1984

[30] Foreign Application Priority Data

Mar. 18, 1983 [JP] Japan .................................. 58-44179

[51] Int. Cl.⁴ ...................... H01L 23/48; H01L 27/04
[52] U.S. Cl. ........................................ 357/71; 357/15; 357/51; 357/23.6
[58] Field of Search .................... 357/51, 71, 15, 23.6, 357/34

[56] References Cited

U.S. PATENT DOCUMENTS

| | | | |
|---|---|---|---|
| 4,211,941 | 7/1980 | Schade | 357/51 |
| 4,245,231 | 1/1981 | Davies | 357/51 |
| 4,377,029 | 3/1983 | Ozawa | 357/51 |

FOREIGN PATENT DOCUMENTS

| | | | |
|---|---|---|---|
| 0025383 | 3/1978 | Japan | 357/51 |
| 53-43485 | 4/1978 | Japan . | |
| 0088774 | 6/1982 | Japan | 357/51 |
| 0206062 | 12/1982 | Japan | 357/51 |
| 0023470 | 2/1983 | Japan | 357/51 |
| 0127359 | 7/1983 | Japan | 357/51 |

OTHER PUBLICATIONS

IBM Tech. Disc. Bulletin, vol. 17, #6, pp. 1569-1570, Nov. 1974, by Arzubi.

Primary Examiner—William D. Larkins
Assistant Examiner—Mark Prenty
Attorney, Agent, or Firm—Antonelli, Terry & Wands

[57] ABSTRACT

A semiconductor device comprising a first electrode, a dielectric film and a second electrode which are stacked and formed on a semiconductor layer with the second electrode in contact with the semiconductor layer. A diode is formed of the second electrode and the semiconductor layer, and a capacitor is formed of the first electrode, the dielectric film and the second electrode.

24 Claims, 4 Drawing Figures

SEMICONDUCTOR DEVICE

BACKGROUND OF THE INVENTION

1. Field of the Invention

The present invention relates to semiconductor devices, and more particularly to a semiconductor device which has a diode and a capacitor.

2. Background of the Invention

As a prior-art semiconductor device, a high-speed bipolar memory cell of a circuit structure shown in FIG. 1 has been proposed in Japanese Laid-Open Patent Application No. 53-43485 which is incorporated herein by reference with regard to the state of the art in this area. This memory cell includes features that diodes $D_1$, $D_2$ are formed in parallel with load resistors $R_1$, $R_2$ as illustrated in the figure, and that the inherent capacitance of the diodes function as capacitors $C_1$, $C_2$. Owing to such arrangement, the memory cell is improved over past ones in the following respects: (1) fast switching is possible; (2) the operating margin increases; and (3) soft errors ascribable to a particles can be prevented.

In order to exploit the three advantages a capacitance of approximately 500 fF is required for each of the capacitors $C_1$, $C_2$. In the semiconductor device, to the end of attaining this capacitance, the inherent capacitance of the Schottky barrier diode is used as the memory cell capacitors $C_1$ and $C_2$, as described above.

Generally, an interface of a platinium silicide layer and a silicon layer or an interface of a palladium silicide layer and a silicon layer is employed for the Schottky barrier diode in the prior-art semiconductor device shown in FIG. 1. The capacitance obtained with such a diode in the prior art is only, at most 3.4 fF/$\mu$m$^2$ or so per unit area. Therefore, the area of the diode becomes as large as 150 $\mu$m$^2$ to the end of attaining the necessary capacitance mentioned above, and the diodes occupy about 30% of the area of the memory cell. This forms a serious hindrance to packaging the bipolar memory cells at a high density.

SUMMARY OF THE INVENTION

An object of the present invention is to solve the problem of the prior art and to provide a semiconductor device having a capacitor of great capacitance per unit area and a diode of small required area.

In order to accomplish the object, the present invention consists in that a first electrode, an insulator film and a second electrode are successively stacked and formed on a semiconductor layer with the second electrode adjacent to the semiconductor layer, whereby a diode comprised of the semiconductor layer and the second electrode, and a capacitor comprised of the second electrode, the insulator film and the first electrode are stacked and formed.

DETAILED DESCRIPTION OF THE PREFERRED EMBODIMENTS

Now, the semiconductor device of the present invention will be described in detail in conjunction with embodiments in which a high-speed bipolar memory cell is taken as an example.

Figure 1:
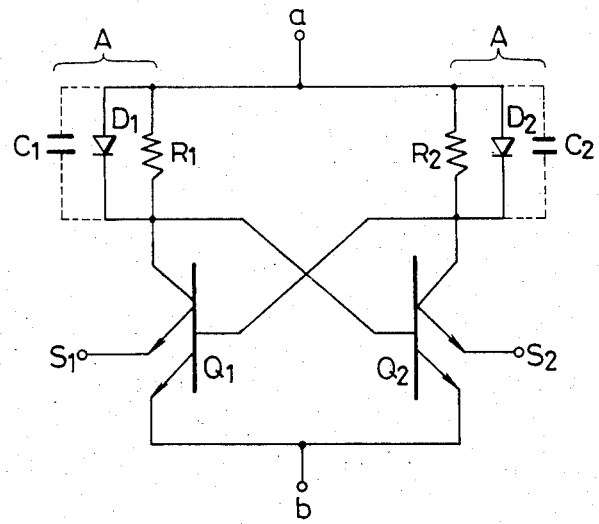
FIG. 1 is a diagram showing an equivalent circuit of a prior-art semiconductor device.
Figure 2A:
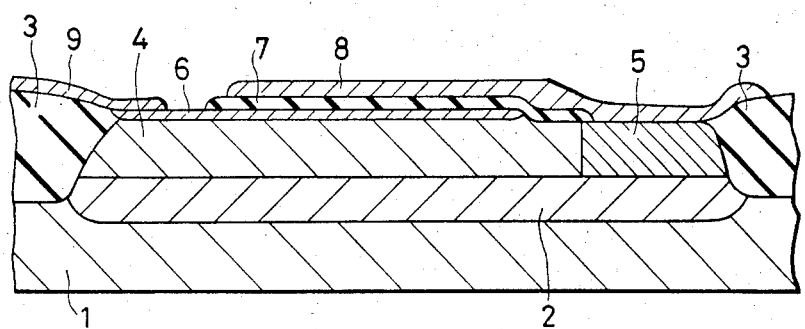
FIGS. 2a, 2b and 2c are a sectional view, a plan view and an equivalent circuit diagram showing an embodiment of the present invention, respectively.
Figure 2B:
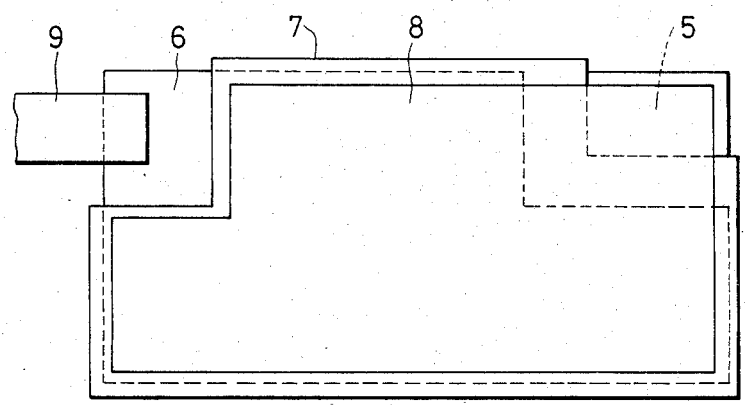
Figure 2C:
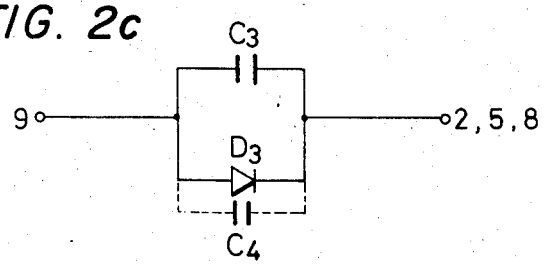

FIG. 2a is a partial sectional view of a bipolar memory cell in one embodiment of the present invention, FIG. 2b is a plan view thereof, and FIG. 2c is an equivalent circuit diagram of the part shown in FIGS. 2a and 2b (corresponding to a part A in the circuit of FIG. 1).

In FIGS. 2a–2c, numeral 1 designates a p-type silicon substrate, numeral 2 an n$^+$ buried layer functioning as a third electrode, numeral 3 an insulator film for isolating elements, numeral 4 a semiconductor layer such as an n-type epitaxial silicon layer, numeral 5 an n$^+$ epitaxial silicon layer, numeral 6 a second electrode such as a palladium silicide layer (or platinum silicide layer), numeral 7 an insulator film such as a tantalum oxide layer, numeral 8 a first electrode such as an Al electrode, and numeral 9 an AL electrode led out from the second electrode. The Al electrode 8 covers both the tantalum oxide layer 7 and the n$^+$epitaxial silicon layer 5 as shown in the drawing.

In the memory cell of such construction, a diode which is a Schottky barrier diode in this case is formed of the palladium silicide layer 6 being the second electrode and the n-type epitaxial silicon layer 4 being the semiconductor layer, while a capacitor is formed of the Al electrode 8 being the first electrode, the tantalum oxide layer 7 being the insulator film and the palladium silicide layer 6 being the second electrode. Accordingly, the capacitor $C_3$ and Schottky barrier diode $D_3$ of a circuit structure equivalently shown in FIG. 2c are formed between the Al electrode 9 connected to the palladium silicide layer 6 and the n$^+$ buried layer 2, n$^+$ epitaxial silicon layer 5 or Al electrode 8. In FIG. 2c, a capacitor $C_4$ signifies a capacitor which is formed by the Schottky barrier diode $D_3$ itself.

Since the relative dielectric constant of the tantalum oxide layer 7 used as the dielectric of the capacitor $C_3$ in the present embodiment is several times as high as those of SiO$_2$ and Si$_3$N$_4$ hitherto generally employed (tantalum oxide: 28, SiO$_2$: 3.8, Si$_3$N$_4$: 7.0), a capacitance per unit area which is as high as 20 fF/$\mu$m$^2$ can be attained at a thickness of about 100 Å. It has also been revealed that the leakage current of the capacitor $C_3$ during memory operation is much smaller than a base current flowing througha load resistor so that no substantial harmful effects are exerted on the memory operation.

Further, in the present invention, the capacitor $C_3$ and the diode $D_3$ are formed in stacked manner. The capacitance per unit area therefore becomes the sum, namely, 23.4 fF/$\mu$m$^2$ between the aforementioned capacitance 20 fF/$\mu$m$^2$ of the capacitor $C_3$ and the capacitance 3.4 fF/$\mu$m$^2$ of the Schottky barrier diode $D_3$. Accordingly, the area of the capacitor and diode for attaining 500 fF indicated before as the capacitance value which is required of the capacitor for the memory cell may be as slight as 21 $\mu$m$^2$, and it can be reduced to one-seventh of the area 150 $\mu$m$^2$ of the diode in the foregoing case of the prior art which employs the Schottky barrier diode capacitance only instead of the capacitor $C_3$ formed by the layers over the diode.

The principal feature of the present invention is that the diode and the capacitor are stacked and formed and that one electrode (the palladium silicide layer 6 in the present embodiment) is used as the common electrode of the capacitor and the diode, thereby to remarkably decrease the required area of the semiconductor device.

Even if the n$^+$-type buried layer 2 was not used in the present embodiment, it would still be possible to form the semiconductor device which has the equivalent circuit shown in FIG. 2c. With this construction, however, the resistance in the plane direction in the semiconductor substrate increases conspicuously, so that the n+-type buried layer 2 should preferably be disposed.

In recent years, enhancement in the operating speed has become more frequently required in bipolar memories. In that case, one of serious obstacles is the magnitude of the electric resistance of a semiconductor layer, namely, the n-type epitaxial silicon layer 4 in the present embodiment. Reduction in this electric resistance is very important for achieving the enhanced speed of the bipolar memory. Therefore, in the present embodiment, the thickness of the n-type epitaxial silicon layer 4 is made very small (for example, below 1 $\mu$m), and the n+ buried layer 2 is disposed as the lower electrode thereof. Then, the electric resistance across the n-type epitaxial silicon layer 4 and the n+ epitaxial silicon layer 5 can be rendered very low and led out by the Al electrode 8. Accordingly, it is very effective for enhancing the operating speed of the bipolar memory that the n+ buried layer 2 being the third electrode is disposed under the n-type epitaxial silicon layer 4 as in the present embodiment.

As the lower electrode (the third electrode) 2, a layer of any of various metals or metal silicides or any other electrode material may well be formed instead of the n+ buried layer 2. In that case, it is desirable that the energy barrier of the interface between the third electrode and the n-type epitaxial silicon layer 4 is lower than the energy barrier of the interface between the palladium silicide layer 6 and the n-type epitaxial silicon layer 4, or that the interface between the third electrode and the n-type epitaxial silicon layer 4 is ohmically connected. While the present embodiment has been illustratively described, the present invention is of course applicable to a semiconductor device which is formed with at least, a first electrode—an insulator film—a second electrode—a semiconductor layer, and a semiconductor device further comprising a third electrode under the semiconductor layer.

In the present embodiment, tantalum oxide has been employed as the material of the dielectric (the tantalum oxide layer 7) for the capacitor as described before. Needless to say, however, this is not restrictive, and oxides of silicon, niobium, titanium, hafnium, aluminum etc. may well be employed instead and can be used similarly to the tantalum oxide.

Further, in the present embodiment, the tantalum oxide layer 7 has been formed on the palladium silicide layer (or platinum silicide layer) being the second electrode 6, with the result that the capacitance as high as 20 fF/$\mu$m$^2$ has been attained. However, when Si or Al is used for the second electrode 6 and a tantalum oxide film is formed on the Si layer or the Al film by the sputtering process or the CVD process, a natural oxide film (SiO$_2$ or Al$_2$O$_3$) of low relative dielectric constant is formed on the surface of the Si layer or the Al film. As a result, even when the tantalum oxide layer is rendered very thin (for example, about 40 Å thick), it is difficult to obtain a capacitor whose capacitance is not lower than 13 fF/$\mu$m$^2$. Accordingly, in the case where the tantalum oxide film is employed as the insulator film to intervene between the first and second electrodes in the present invention, it is more preferable to avoid using Si or Al for the second electrode 6. Even in this case, however, when a metal or silicide film, e. g., a tungsten film is interposed between the tantalum oxide film and the Si or Al film, the formation of the aforementioned oxide is prevented, and a capacitor and a diode having favorable characteristics can be formed.

On the other hand, in case of employing as the second electrode 6 the silicide layer of any of various metals such as a palladium silicide layer or a platinum silicide layer and forming thereon the oxide film of a transition metal 7 such as the tantalum oxide layer as the insulator, the adhesion between the metal silicide layer and the insulator film becomes poor under inappropriate conditions of forming the insulator film 7, and the insulator film can peel off. In that case, when a film of a metal such as tantalum, niobium, titanium, hafnium or zirconium is interposed between the metal silicide layer 6 and the insulator film 7, the effect of preventing the insulator film from peeling off is great. Therefore, in the case of employing the metal silicide film as the second electrode and the tantalum oxide film as the insulator film, it is preferable in practical use to interpose the metal or alloy film between both the above films. In addition, even when a film of an alloy such as titanium-tungsten is used as the metal film, a favorable result is similarly obtained. Further, when the insulator film 7 for the capacitor is formed by oxidizing the metal silicide 6, the manufacturing process is simplified, and the lowering of the available percentage of the semiconductor device attributed to the peeling of the insulator film can be prevented.

While the metal silicide for the layer 6 has been illustrated as palladium silicide or platinum silicide in the present embodiment, this is not restrictive, and various silicides such as tantalum silicide, tungsten silicide, molybdenum silicide, titanium silicide and hafnium silicide can be similarly used. When the oxide such as tantalum oxide is formed on the surface of the metal silicide layer, an oxide of the metal silicide is produced at the interface between the metal silicide layer 6 and the insulator film 7. Since, however, such oxide has a relative dielectric constant nearly equal to that of the tantalum oxide, the decrease in the capacitance is very slight.

Besides the films of the metal silicides for the layer 6, films of various metals such as W, Mo, Ta, Al and Ti or films of various alloys such as Ti-W can be used. Needless to say, such metal silicide film, metal film or alloy film may be used in the form of a single layer, or films which have a plurality of different materials can be used in the form of stacked layers.

As the dielectric film 7 which intervenes between the first and second electrodes, the aforementioned tantalum oxide and various other dielectrics such as SiO$_2$, Si$_3$N$_4$, aluminum oxide, niobium oxide, titanium oxide, and hafnium oxide can be employed in the form of a single layer or a composite layer of a plurality of different materials. A plurality of different types of such oxides may well be used as stacked layers. Alternatively, an oxide film produced by oxidizing the surface of the second electrode may well be used as the dielectric film.

Meanwhile, Al has been used for the first electrode 8 and the wiring 9 in the embodiment. In a case where a process of high-temperature treatment is required after forming these electrodes, the potential problem exists that the Al and the tantalum oxide of the insulator film 7 will react at high temperatures to short-circuit the capacitor. In addition, it is sometimes the case that the Al and the metal silicide react in the connection part between the electrode 9 and the electrode 6, so the characteristics of the diode fluctuate. In order to avoid such a situation, refractory metal such as titanium, tungsten or molybdenum may be used for the first electrode 8 and wiring 9, or a film of the metal may be formed on the lower surface of the Al. Since the refractory metal exhibits a high electric resistance, preferably the refractory metal film and Al film are stacked into a multilayer structure in the whole or at least a part of the electrode 9 or 8. Such structure provides a semiconductor device of good heat resistance.

What is claimed is:

1. A semiconductor bipolar memory device comprising:
   a first semiconductor layer; and
   a first electrode, a dielectric film and a second electrode comprised of metal silicide formed on said first semiconductor layer with said second electrode being adjacent to said first semiconductor layer, said dielectric film being formed on said second electrode and said first electrode being formed on said dielectric film so that said first semiconductor layer and said second electrode from a Schottky barrier diode and said first electrode, said dielectric film and said second electrode from a capacitor on said diode, wherein a metal film is interposed between said second electrode and said dielectric film.

2. A semiconductor device according to claim 1, wherein said second electrode is comprised of a single layer of metal silicide.

3. A semiconductor device according to claim 1, wherein said second electrode is comprised of a film of stacked layers of metal silicides.

4. A semiconductor device according to claim 2, wherein said metal silicide is selected from the group consisting of palladium silicide, platinum silicide, tantalum silicide, tungsten silicide, molybdenum silicide, titantium silicide and hafnium silicide.

5. A semiconductor device according to claim 3, wherein said metal silicides are selected from the group consisting of palladium silicide, platinum silicide, tantalum silicide, tungsten silicide, molybdenum silicide, titanium silicide and hafnium silicide.

6. A semiconductor device according to claim 1, wherein said dielectric film is comprised of tantalum oxide.

7. A semiconductor device according to claim 1, wherein said dielectric film comprises a single layer selected from a group consisting of tantalum oxide, niobium oxide, titanium oxide, hafnium oxide, aluminum oxide, silicon dioxide and silicon nitride.

8. A semiconductor device according to claim 1, wherein said dielectric film is comprised of a film of stacked layers of different materials which layers are selected from a group consisting of tantalum oxide, niobium oxide, titanium oxide, hafnium oxide, aluminum oxide, silicon dioxide and silicon nitride.

9. A semiconductor device according to claim 1, wherein said dielectric film is a film formed by oxidizing a surface of said second electrode.

10. A semiconductor device according to claim 9, wherein said dielectric film is an oxide film of a transition metal.

11. A semiconductor device according to claim 1, wherein said dielectric film is a film of an oxide of a transition metal.

12. A semiconductor device according to claim 11, wherein the metal silicide is at least one member selected from a group consisting of platinum silicide, palladium silicide, tantalum silicide, tungsten silicide, molybdenum silicide, titanium silicide and hafnium silicide.

13. A semiconductor device according to claim 1, wherein said metal film is made of member selected from a group consisting of tantalum, niobium, titanium, hafnium and zirconium.

14. A semiconductor device according to claim 1, further comprising a third electrode formed of high conductivity material located under said first semiconductor layer and coupled to said first electrode through a high conductivity connection.

15. A semiconductor device according to claim 14, wherein said first semiconductor layer is of a first conductivity type and said third electrode is formed of a semiconductor material of said first semiconductor type having a higher impurity concentration than said first semiconductor layer.

16. A semiconductor device according to claim 15, wherein said first semiconductor layer has a thickness of less than 1 $\mu$m.

17. A semiconductor device according to claim 14, wherein said third electrode is comprised of a metal or a metal silicide.

18. A semiconductor device according to claim 17, wherein said first semiconductor layer has a thickness of less than 1 $\mu$m.

19. A semiconductor device according to claim 1, wherein said first electrode is comprised of aluminum.

20. A semiconductor device according to claim 1, wherein said first electrode is comprised of a refractory metal.

21. A semiconductor memory device comprising:
    a semiconductor substrate having a first conductivity type; and
    an assembly formed on said first semiconductor substrate comprising a first electrode, a dielectric film, a second electrode comprised of metal silicide, a first semiconductor layer of a second conductivity type opposite to said first conductivity type and a third electrodes arranged so that said third electrode is adjacent to said substrate, said first semiconductor layer is formed on said third electrode, said second electrode is formed on said first semiconductor layer, said dielectric film is formed on said second electrode and said first electrode is formed on said dielectric film with said first electrode being coupled to said third electrode through a high conductivity connection region which extends through said first semiconductor layer,
    wherein said first semiconductor layer and said second electrode form a Schottky barrier diode and said first electrode, said dielectric film and said second electrode form a capacitor on said diode, wherein a metal film is interposed between said second electrode and said dielectric film.

22. A semiconductor device according to claim 21, wherein said dielectric film is comprised of an oxide film of a transition metal.

23. A semiconductor device according to claim 21, wherein said third electrode is comprised of a high conductivity semiconductor material having said second conductivity with a higher impurity concentration than said first semiconductor layer.

24. A semiconductor device according to claim 21, wherein said third layer is comprised of a metal or a metal silicide.

* * * * *